(12) United States Patent
Burr

(10) Patent No.: US 11,183,238 B2
(45) Date of Patent: Nov. 23, 2021

(54) SUPPRESSING OUTLIER DRIFT COEFFICIENTS WHILE PROGRAMMING PHASE CHANGE MEMORY SYNAPSES

(71) Applicant: International Business Machines Corporation, Armonk, NY (US)

(72) Inventor: Geoffrey Burr, San Jose, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 205 days.

(21) Appl. No.: 16/554,018

(22) Filed: Aug. 28, 2019

(65) Prior Publication Data

US 2021/0065794 A1   Mar. 4, 2021

(51) Int. Cl.
  *G11C 13/00* (2006.01)
  *G06F 3/06* (2006.01)
  *G06N 3/04* (2006.01)

(52) U.S. Cl.
  CPC ........ *G11C 13/0069* (2013.01); *G06F 3/0604* (2013.01); *G06F 3/0659* (2013.01); *G06F 3/0679* (2013.01); *G06N 3/04* (2013.01); *G11C 13/0004* (2013.01); *G11C 2213/79* (2013.01)

(58) Field of Classification Search
  None
  See application file for complete search history.

(56) References Cited

U.S. PATENT DOCUMENTS

| | | |
|---|---|---|
| 7,978,508 B2 | 7/2011 | Czubatyj |
| 8,767,447 B2 | 7/2014 | Lam et al. |
| 10,043,576 B2 | 8/2018 | Robustelli |

(Continued)

FOREIGN PATENT DOCUMENTS

| | | |
|---|---|---|
| CN | 107425118 A | 12/2017 |
| CN | 105427892 B | 5/2018 |
| KR | 20180089055 A | 8/2018 |

OTHER PUBLICATIONS

Notification of Transmittal of The International Search Report and The Written Opinion Of The International Searching Authority, or The Declaration, issued in International Application No. PCT/IB2020/056747 dated Nov. 3, 2020; 10 pages.

(Continued)

*Primary Examiner* — Tan T. Nguyen
(74) *Attorney, Agent, or Firm* — Cantor Colburn LLP; Randall Bluestone

(57) ABSTRACT

A computer-implemented method for suppressing outlier drift of a phase change memory (PCM) device includes programming, by a controller, a conductance of the PCM device, wherein the programming includes configuring the conductance of the PCM device to a first conductance value at a first time-point, the first time-point being a programming time-point. The programming further includes determining, at a first pre-compensation time-point, that the conductance of the PCM device has changed to a second conductance value that differs from a target conductance value by no more than a predetermined threshold. Further, the programming includes, based on the above determination, reprogramming the PCM device to the first conductance value at a second time-point, including measuring said pre-compensation again, but at a second pre-compensation time-point.

25 Claims, 11 Drawing Sheets

(56) References Cited

U.S. PATENT DOCUMENTS

| | | | |
|---|---|---|---|
| 10,079,058 B1 | 9/2018 | Eleftheriou et al. | |
| 10,910,051 B1* | 2/2021 | Huang | G11C 13/0064 |
| 2008/0316792 A1* | 12/2008 | Philipp | G11C 13/0004 |
| | | | 365/148 |
| 2010/0299296 A1 | 11/2010 | Modha et al. | |
| 2011/0026319 A1* | 2/2011 | Kim | G11C 13/0004 |
| | | | 365/163 |
| 2012/0084240 A1 | 4/2012 | Esser et al. | |
| 2014/0321191 A1* | 10/2014 | Bedeschi | G11C 13/0033 |
| | | | 365/148 |
| 2018/0253642 A1 | 9/2018 | Gokmen et al. | |
| 2019/0156194 A1 | 5/2019 | Burr | |

OTHER PUBLICATIONS

Sidler, et al., "Large-scale neural networks implementd with non-volatile memory as the synaptic weight element impact of conductance response," 2016 46th Eurpean Solid-State Device Research Conference (ESSDERC); Oct. 20, 2016: ISSN:2378-6558; pp. 440-443.

Disclosed anonymously (Aug. 2014). Cell Design for MLC Capability Using Thermoelectrics. IPCOM000238358D.

Li et al. (2018) Understanding phase-change materials with unexpectedly low resistance drift for phase-change memories. Journal of Materials Chemistry C, 6(13), 3387-3394.

Noe et al. Phase-change materials for non-volatile memory devices: from technological challenges to materials science issues. Semiconductor Science and Technology, 33(1), 013002, (2017).

* cited by examiner

SUPPRESSING OUTLIER DRIFT COEFFICIENTS WHILE PROGRAMMING PHASE CHANGE MEMORY SYNAPSES

BACKGROUND

The present invention generally relates to computer technology, and more specifically, to programming a phase-change memory (PCM), and to methods of suppressing outlier drift while programming PCM.

PCM exploits characteristics of materials that have the property of switching between two phases having distinct electrical characteristics. For example, these materials can switch between an amorphous, disordered phase and a crystalline or polycrystalline, ordered phase. These two phases are associated with considerably different values of resistivity. In addition, intermediate configurations, in which the material has only partially switched to the amorphous phase or to the crystalline phase, can be associated with intermediate values of resistivity.

SUMMARY

According to one or more embodiments of the present invention, computer-implemented method for suppressing outlier drift of a phase change memory (PCM) device includes programming, by a controller, a conductance of the PCM device, wherein the programming includes configuring the conductance of the PCM device to a first conductance value at a first time-point, the first time-point being a programming time-point. The programming further includes determining, at a first pre-compensation time-point, that the conductance of the PCM device has changed to a second conductance value that differs from a target conductance value by no more than a predetermined threshold. Further, the programming includes, based on the above determination, reprogramming the PCM device to the first conductance value at a second time-point, including measuring said pre-compensation again, but at a second pre-compensation time-point. The conductance of the PCM device changes to the second conductance value because of conductance drift.

In one or more examples, the pre-compensation time-point is at a predetermined time duration after the programming time-point. Further, in one or more examples, the target conductance value at the first pre-compensation time-point is determined based on a target time window, which is at a second predetermined duration after the programming time-point. The conductance of the PCM device is to be maintained in a particular range during the target time window.

In one or more examples, the programming is continued until the difference between (i) the second conductance value at the pre-compensation time-point and (ii) the target conductance value is less than the predetermined threshold.

If, at the pre-compensation time-point, the difference between the second conductance value at the pre-compensation time-point and the target conductance value is less than the predetermined threshold, the method further includes determining, at a first checkpoint, that the conductance of the PCM device has changed to a third conductance value that differs from a second target conductance value by no more than the predetermined threshold. The method further includes programming the PCM device to the first conductance value at a third time-point, including measuring said pre-compensation again.

In one or more examples, the first checkpoint is at a second predetermined time duration after the programming time-point. The second target conductance value at the first checkpoint is determined based on a target time window, which is at a second predetermined duration since the programming time-point, wherein the conductance of the PCM device is maintained within a particular range during the target time window.

In one or more examples, the PCM device is being used as a synapse in an artificial neural network system, the conductance being a weight that is assigned to the synapse.

In one or more examples, the PCM device includes multiple PCM devices, each PCM device being associated with a respective target conductance value.

The above-described features can also be provided at least by a system, a computer program product, and a machine.

According to one or more embodiments of the present invention, a computer-implemented method includes configuring, from a plurality of phase change memory (PCM) devices in a cross-bar array, a conductance value of a PCM device by receiving a signal to configure the conductance of the PCM device to a first conductance value at a first time-point, the first time-point being a programming time-point. The method further includes determining, at a pre-compensation time-point, that the conductance of the PCM device has changed to a second conductance value that differs from a target conductance value by no more than a predetermined threshold. The method further includes, receiving another signal to configure the conductance of the PCM device to the first conductance value at a second time-point, including measuring said pre-compensation again, but at a second pre-compensation time-point.

The above-described features can also be provided at least by a system, a computer program product, and a machine.

One or more embodiments of the present invention accordingly facilitate a practical application and an improvement to computer technology, particularly for programming PCM devices and suppressing the outlier drift. Embodiments of the present invention can be applied when it is known what the weights of PCM devices are supposed to be, and the PCM devices are programmed in such a way that they arrive at the right weight value at the right time in the future. Because the evolution of the PCM devices is on a log scale, the realization is that even after a relatively small (compared to when the weight is to be used) time duration (e.g., 1 second, 1 minute, etc.), measurements of the weights of the PCM devices can be used to predict whether the PCM device will have the desired target weight at the desired target time window (e.g., 6 months, a year, etc.).

The pre-compensation time-point is at a predetermined time duration after the programming time-point. The target conductance value at the pre-compensation time-point is determined based on a target time window, which is at a second predetermined duration after the programming time-point. The conductance of the PCM device is to be maintained in a particular range during the target time window.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
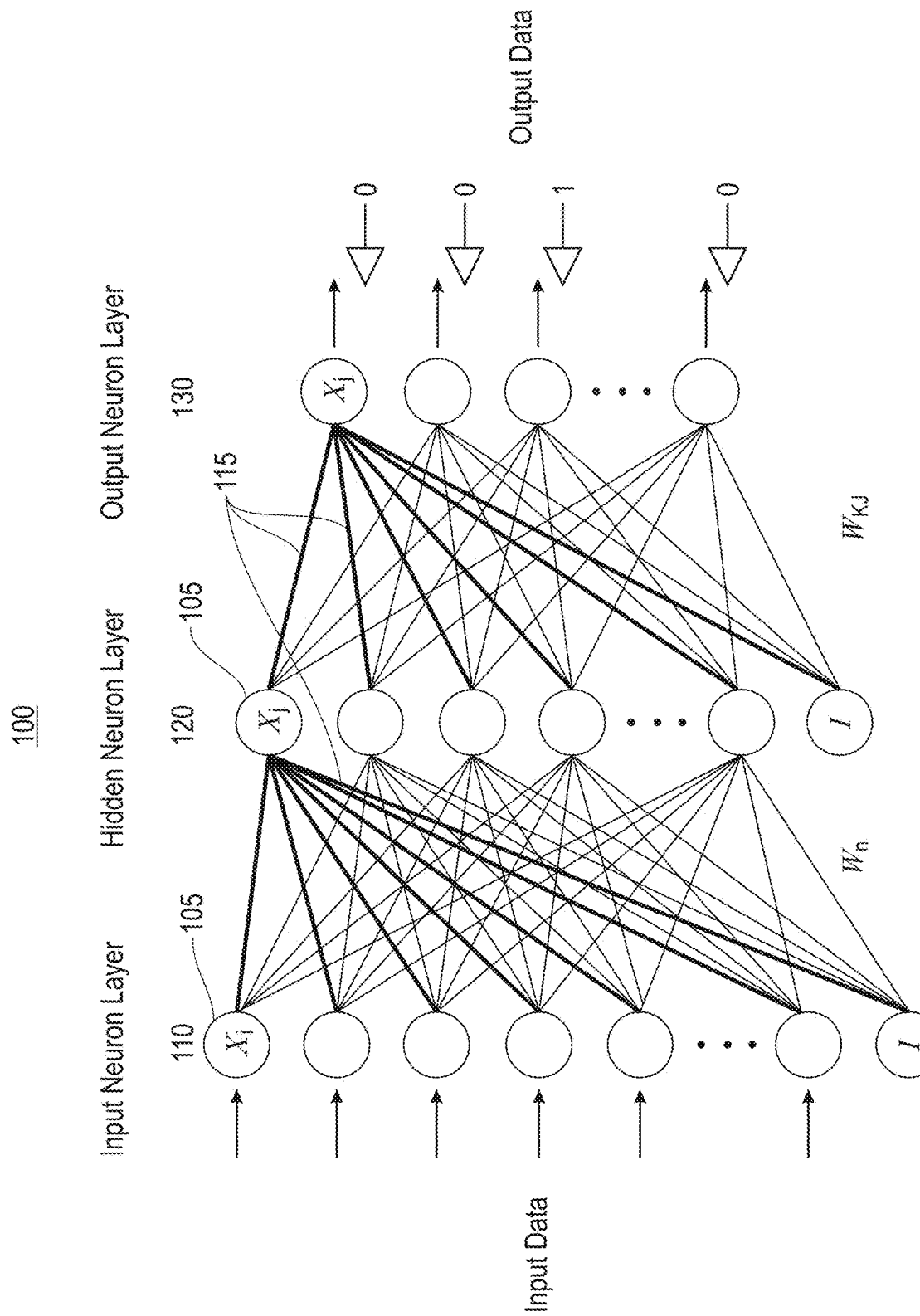
FIG. 1 depicts a block diagram of a deep neural network.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describe having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three-digit reference numbers. With minor exceptions, the leftmost digit(s) of each reference number corresponds to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e., two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

As noted earlier, phase-change memory (PCM) elements exploit the characteristics of materials that have the property of switching between two phases having distinct electrical characteristics. Currently, the alloys of Group VI of the periodic table, such as Te or Se, referred to as chalcogenides or chalcogenic materials, can be advantageously used in phase-change cells. In chalcogenides, the resistivity varies by two or more orders of magnitude when the material passes from the amorphous phase (more resistive) to the crystalline phase (less resistive) and vice versa.

Such characteristics make PCM elements highly suitable for providing memory cells and arrays for digital and analog data storage. In particular, in phase-change memories, a portion of chalcogenide material is used as a programmable resistor, which can be electrically heated by a controlled current so as to switch between a high resistance condition and a low resistance condition and vice versa, respectively associated to which are a first logic value and a second logic value. The state of the chalcogenide can be read by applying a voltage sufficiently low as not to cause heating and by measuring the current that traverses it. Since the current is proportional to the conductance of the chalcogenide material, it is possible to distinguish the two states. For example, a chalcogenide that is formed by an alloy of Ge, Sb, and Te (Ge2Sb2Te5, GST), is widely used for storing information in overwritable memory devices, such as in computers and other types of digital storage devices.

The phase transitions between the highly resistive amorphous state and the highly conductive crystalline state can be induced electrically through current pulses of appropriate amplitude and duration. In particular, the transition towards the amorphous state ("reset") is obtained by applying current pulses of an amplitude sufficient to heat the chalcogenide beyond the melting point by the Joule effect. The current pulses that are used have steep edges so that cooling of the chalcogenide is sufficiently fast to prevent crystallization, for example, rectangular current pulses. The transition towards the crystalline state ("set") can be induced using different techniques. Accordingly, because the conductances of the phases of the PCM device differ, it is possible to use this phenomenon to store bits. It is also possible to control the internal temperature and its temporal evolution, such that the bit enters a state with intermediate conductance. In addition to storing bits, this can be used to perform calculations, as a predetermined group (or set) of sub-threshold phase changes can gradually add up to a bit flip.

The advantages of doing calculations this way are twofold: it avoids trips back and forth to memory because the operations take place in memory, and operations can be done in parallel. Those differences have natural parallels with the behavior of a population of neurons, which makes PCM devices suitable for use in artificial neural networks (ANNs), such as a deep neural network (DNN).

PCM further lends itself for use in DNNs (or other types of neural networks). This is because the neuronal activity is not a binary, all-or-nothing state—it can adopt a range of intermediate behaviors between on and off. Therefore, a PCM device's ability to adopt a state between 1 and 0 allows it to directly model the behavior of neurons.

To use this for training, a grid (or array) of PCM devices (bits) can be mapped to each layer of a DNN. A communication network made of wiring allows the neurons to communicate among themselves. The strength of that communication is set by the state of the memory—where it is on the spectrum between fully on and fully off. That state, in turn, is set by all the bits that feed into it. The communication hardware translates the variable-strength signals from a phase-change bit into signals of different durations, which are compatible with the digital communication network.

Typically, for implementing a DNN, forward inferencing calculations can be slow and energy-intensive, owing to the need to transfer the weight data for the network between conventional digital memory chips and processor chips and the need to constantly maintain the weights in memory. As described above, analog non-volatile memory based on PCM can accelerate forward inference and reduce energy consumption by performing parallelized multiply-accumulate operations in the analog domain, at the location of the weight data, reducing the need to refresh stored weight data in memory. Practical applications of such a DNN are unlimited and can include real-time sensor data processing and inference for IoT devices, and the like.

The accuracy of forward inference strongly depends on the accuracy of weight programming. However, programming analog memory, such as PCM, to the desired analog conductance values is not trivial, especially with variability in an analog memory array. After a PCM device is programmed to a particular resistance state (for example, this may be the low resistance or SET state, high resistance or RESET state, or some intermediate state between the SET/RESET states such as R1, R2 or R3), the particular resistance value of the resistance state may drift over time. For example, resistance drift is a physical process whereby PCM devices continue to show steady linear increases in LOG (resistance) (equivalent to, decreases in LOG (conductance)) as a function of LOG (time). Although this means that, as a linear function of time, conductance first drops rapidly and then appears to saturate (as a linear function of time), over a time interval that is at least a predetermined duration (e.g. 6 weeks, 3 months, 1 year, etc.) the conductance continues to drop. Such drift may create a problem in distinguishing one resistance state from another, especially when the memory device is operated in a multi-state mode. This can cause a system, such as an ANN, that uses the PCM devices either to be forced to reprogram the PCM devices repeatedly or to produce unexpected results (because of different values from the PCM devices). Henceforth, in this document, the minimum duration after which the drift causes the conductance value of a PCM device to change by at least a predetermined value is referred to as a "drift duration."

For forward-inference of ANNs implemented using PCM devices that were programmed at least in the past, while the average loss of conductance can be partially compensated by scaling up the read currents, the spread of conductance due to random cycle-to-cycle variations in drift coefficient "nu" cannot readily be corrected in this manner. There remains a need for a way to avoid encoding synaptic weight data into PCM-based synaptic weights which are going to be poorly corrected by an average scaling coefficient.

The techniques described herein using one or more embodiments of the present invention overcome such technical challenges. One or more embodiments of the present invention accordingly facilitate a practical application and an improvement to computer technology, particularly for programming PCM devices and suppressing the outlier drift. Other advantages and practical applications provided by one or more embodiments of the present invention will be apparent to those skilled in the art based on the description herein.

One or more embodiments of the present invention address the technical challenges described herein based on the conductance first dropping and later saturating. However, once the PCM device is programmed (programming event), the conductance evolution always is a straight line on a LOG (conductance) vs. LOG (time) plot, so long as the time is the time since the programming event. Using some other t=0 origin point either leads to data points that violate causality or to curves which are flat for the first orders-of-magnitude in the time axis and only later curve to match the real underlying nu coefficient.

A description of one or more embodiments of the present invention is now provided that include using PCM devices as synapses in ANNs and that address the technical challenges by integrating techniques for suppressing the outlier drift coefficients while programming the synapses in the ANNs.

FIG. 1 depicts a block diagram of a deep neural network. The depicted DNN 100 has an input layer 110, a hidden layer 120, and an output layer 130, each layer including neurons 105. DNNs are loosely inspired by biological neural networks. The neurons 105 act as parallel processing units that are interconnected by plastic synapses. By tuning weights of the interconnections, the DNN 100 can solve certain problems, such as classification problems, efficiently. The training of the DNN 100 is generally based on a global supervised learning algorithm typically referred to as back-propagation. During the training, the input data are forward-propagated through the neuron layers 110, 120, and 130, with the synaptic networks performing multiply-accumulate operations. The final layer (output layer 130) responses are compared with the input data labels and the errors are back-propagated. Both the forward-propagation and backward-propagation steps involve sequences of matrix-vector multiplications. Subsequently, the synaptic weights are updated to reduce the error. Because of the need to repeatedly perform these operations using very large datasets (multiple-gigabytes) to very large neural networks, this brute force optimization approach can take multiple days or weeks to train state-of-the-art networks on von Neumann machines. Accordingly, in one or more embodiments of the present invention, a co-processor that includes multiple cross-bar arrays of PCM devices and other analog communication links and peripheral circuitry to accelerate such steps of deep learning is used.

Figure 2A:
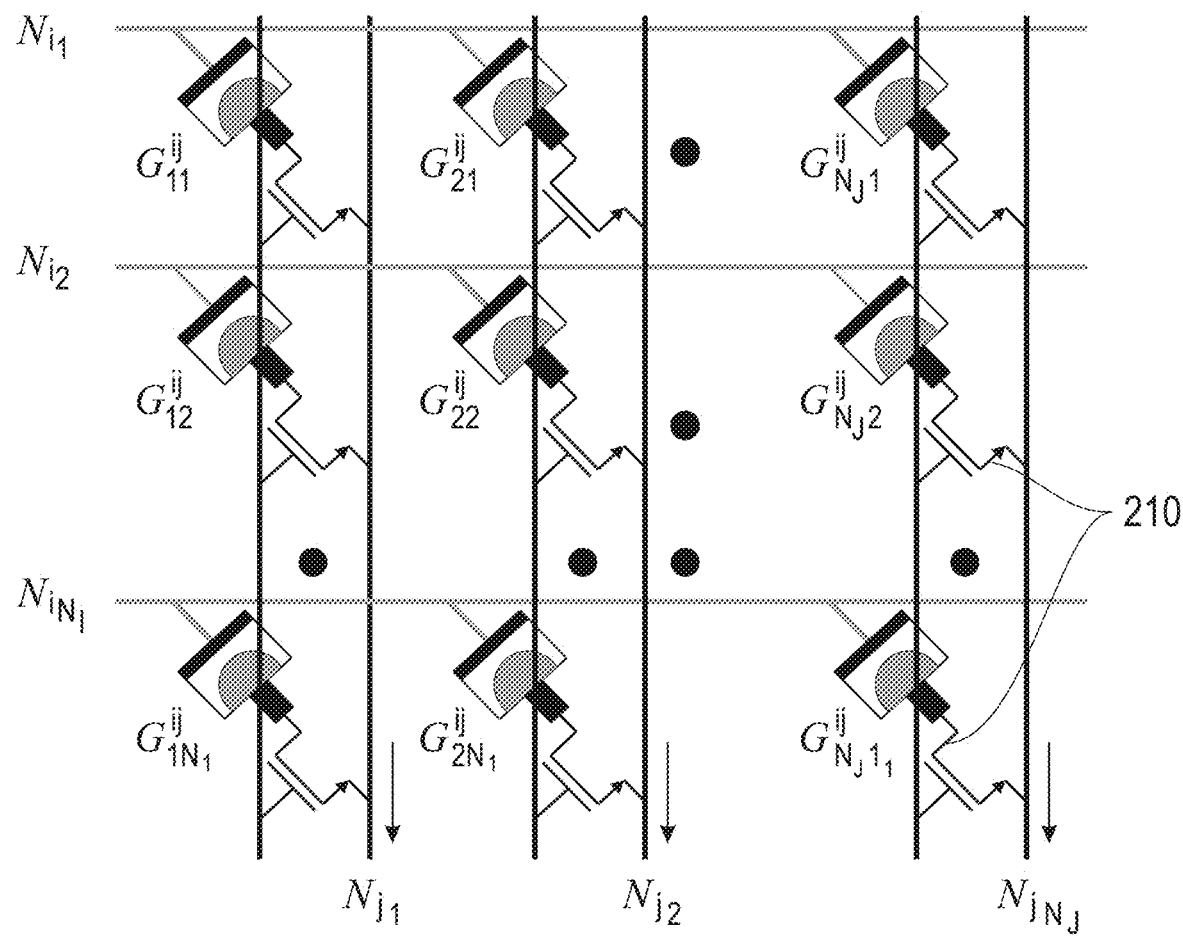
FIG. 2A, FIG. 2B, and FIG. 2C depict block diagrams of a deep neural network using a cross-bar array of analog memory according to one or more embodiments of the present invention.
Figure 2B:
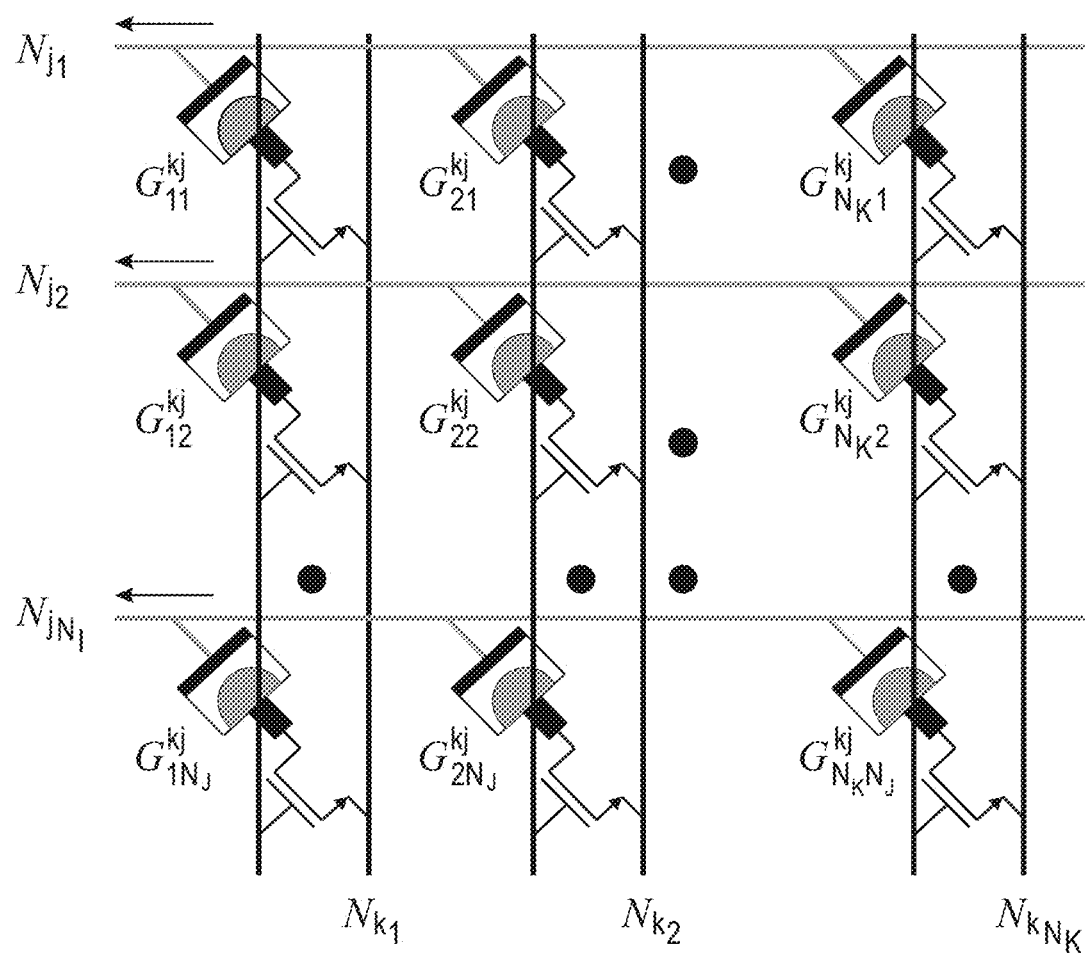
Figure 2C:
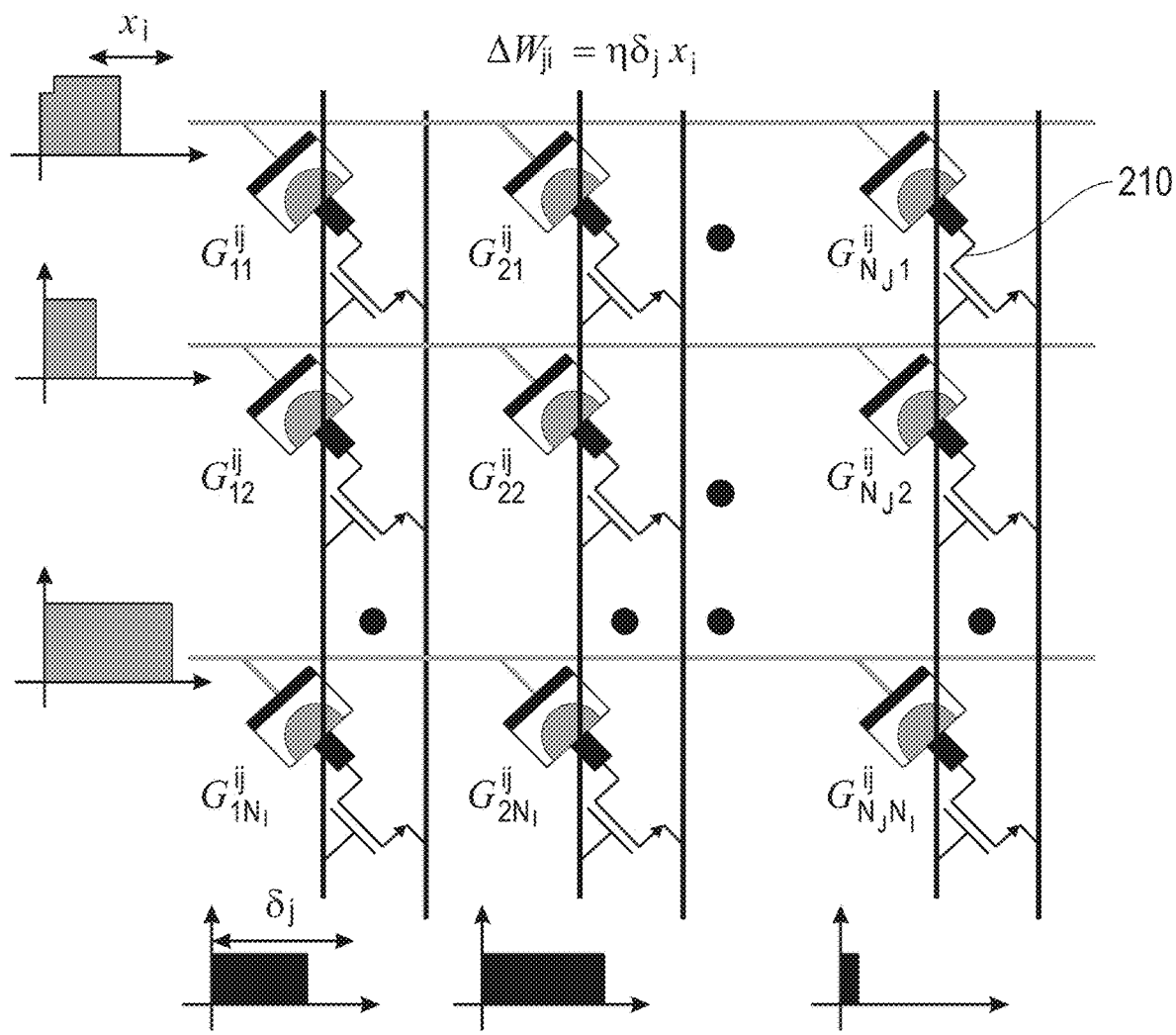

FIG. 2A, FIG. 2B, and FIG. 2C depict block diagrams of a deep neural network using a cross-bar array of analog memory according to one or more embodiments of the present invention. The synaptic weights associated with each layer (110, 120, and 130) of the DNN 100 in terms of the conductance values of non-volatile memory (NVM) devices 210 organized in a cross-bar array 200. The NVM devices 210 can be PCM devices, resistance random access memory (RRAM) devices, and the like. In FIGS. 2A, 2B, and 2C, various phases of implementing the DNN 100 are depicted—a forward propagation in FIG. 2A, a backward propagation in FIG. 2B, and a weight update in FIG. 2C.

In one or more examples, there are multiple such cross-bar arrays respectively corresponding to each of the multiple layers (110, 120, and 130) of the DNN 100. According to one or more embodiments of the present invention, a co-processor/chip/system includes such cross-bar arrays 200 along with additional peripheral circuitry to implement the neuronal activation functions and communication between the cross-bar arrays 200.

Figure 3:
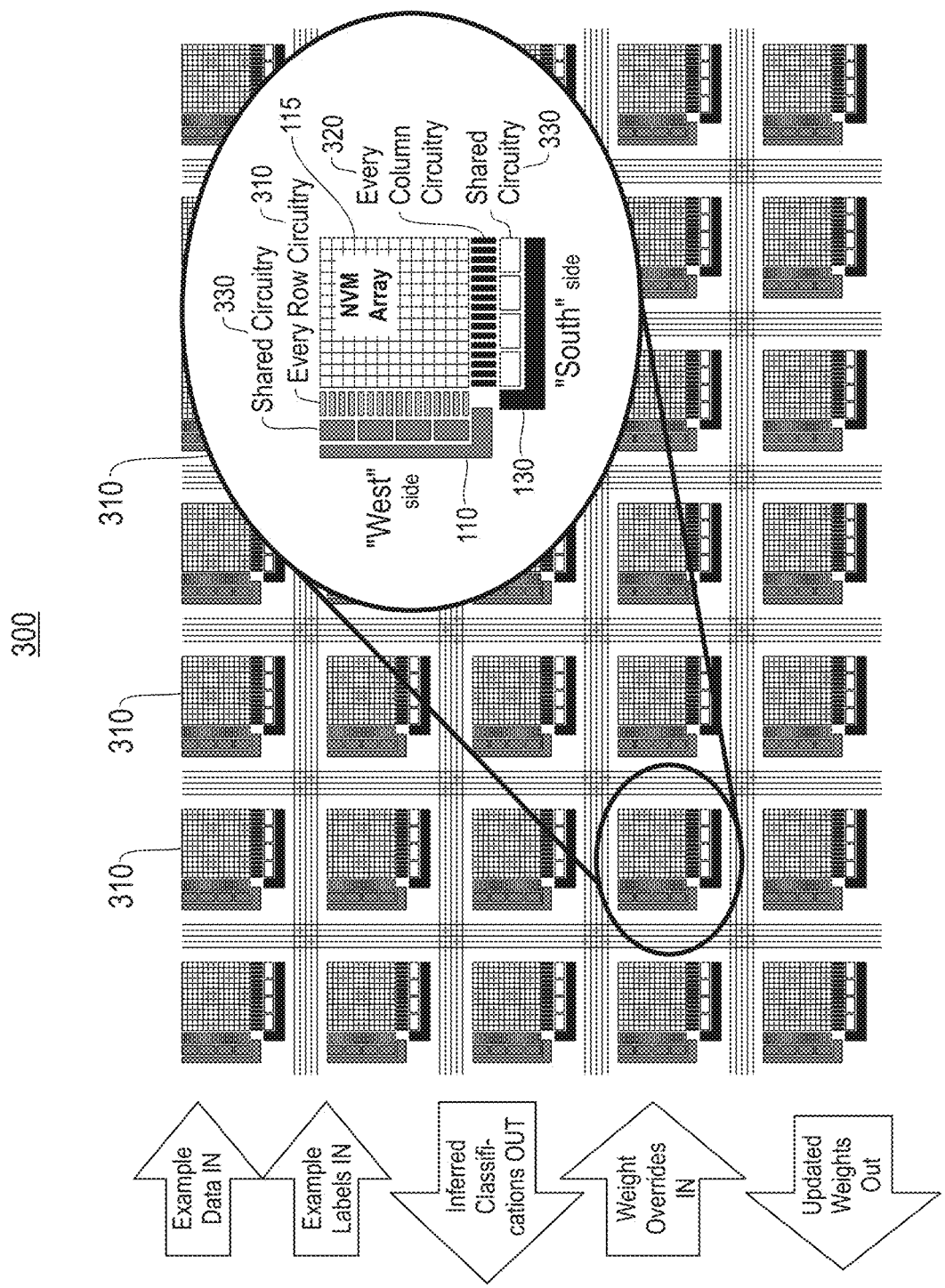
FIG. 3 depicts a block diagram of a phase change memory array device according to one or more embodiments of the present invention.

FIG. 3 depicts a block diagram of a phase change memory array device according to one or more embodiments of the present invention. The architecture depicts multiple identical array-blocks 310 connected by a flexible routing network on a chip/system 300. Each array-block 310 represents a cross-bar array 200 of NVM devices 210. The flexible routing network has at least three tasks: (1) to convey chip inputs (such as example data, example labels, and weight overrides) from the edge of the chip 300 to the device arrays 310, (2) to carry chip outputs (such as inferred classifications and updated weights) from the arrays 310 to the edge of the chip 300, and (3) to interconnect various arrays 310 in order to implement multi-layer neural networks. Each array 310 has input neurons 110 (here shown on the "West" side of each array) and output neurons 130 ("South" side), connected with a dense grid of synaptic connections 115. Peripheral circuitry is divided into circuitry assigned to individual rows (row circuitry 320) and columns (column circuitry 330), circuitry shared between a number of neighboring rows and columns.

According to one or more embodiments of the present invention, NVM devices 210 (for example, PCM devices) in the crossbar array 200 are programmed according to pre-trained weights. A pre-trained weight is a weight that the NVM device 210 should implement within the neural network computations, despite any uncertainty/distribution of the drift that the NVM device 210 will undergo between the programming time and the point in the future, the actual inference use time.

Figure 4:
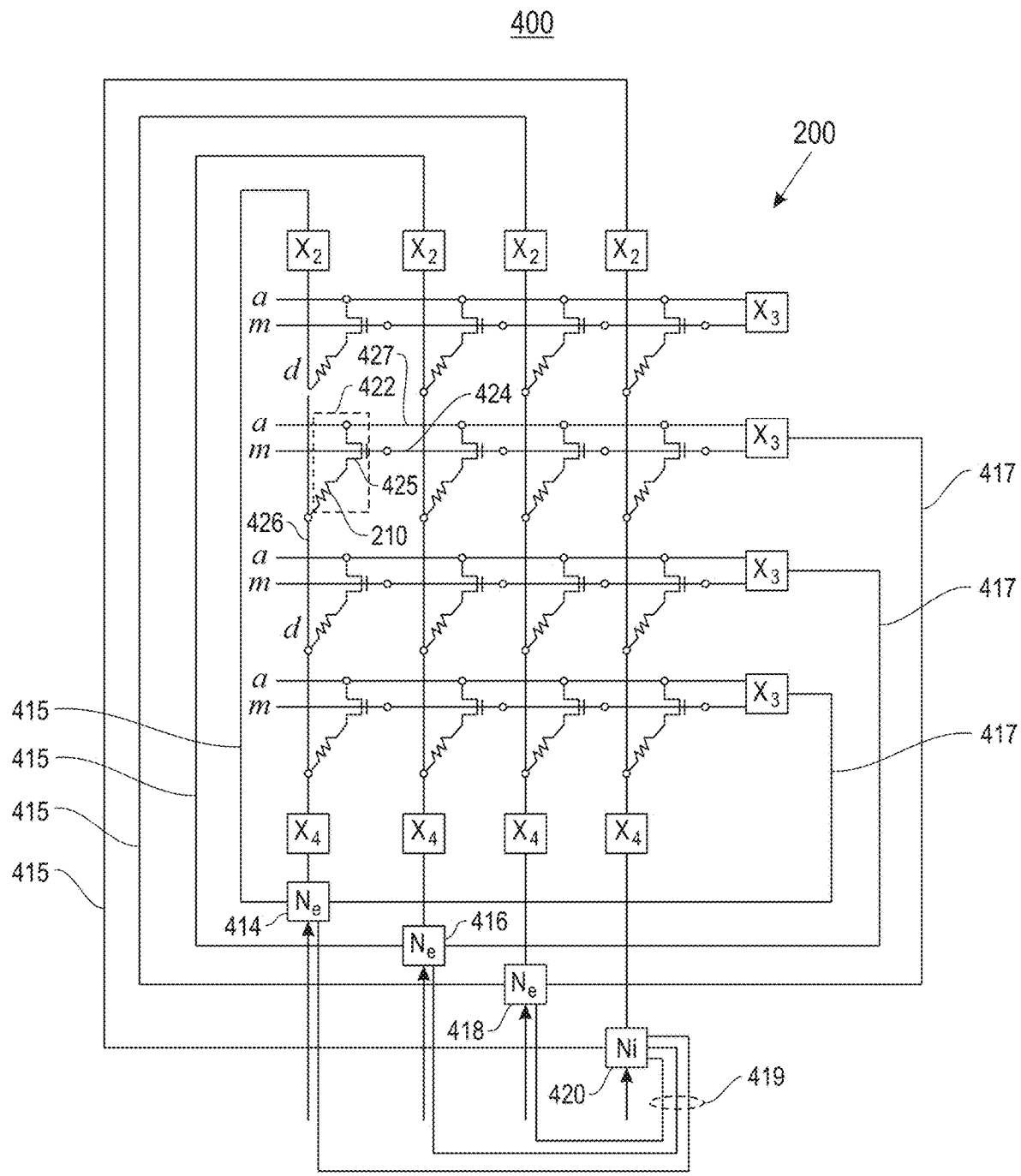
FIG. 4 depicts a structure of a neuromorphic system implemented using a cross-bar array coupled to multiple neurons as a network according to one or more embodiments of the present invention.

FIG. 4 depicts a structure of a neuromorphic system implemented using a cross-bar array coupled to multiple neurons as a network according to one or more embodiments of the present invention. The depicted neuromorphic system 400 includes multiple neurons 414, 416, 418 and 420 interconnected using the cross-bar array 200. In one example, the cross-bar array 200 has a pitch in the range of about 0.1 nm to 10 µm. The system 400 further includes synapse devices 422 including the NVM devices 210 used as variable state resistors at the cross-point junctions of the cross-bar array 412. The synapse devices 422 are connected to axon paths 424, dendrite paths 426 and membrane paths 427, such that the axon paths 424 and membrane paths 427 are orthogonal to the dendrites 426. The terms "axon path", "dendrite path" and "membrane path", are sometimes referred to as "axon", "dendrite" and "membrane", respectively.

The cross-bar array 200, which can be a nanoscale cross-bar array including the NVM devices 210 at the cross-point junctions, is employed to implement arbitrary and plastic connectivity between said electronic neurons. Each synapse device 422 further includes an access or control device 425 that can include a field-effect transistor (FET), which is not wired as a diode, at every cross-bar junction to prevent cross-talk during signal communication (neuronal firing events) and to minimize leakage and power consumption. It should be noted that in other embodiments, other types of circuits can be used as control devices 425, and a FET is used in the description herein as one possible example.

The electronic neurons 414, 416, 418, and 420 are configured as circuits at the periphery of the cross-bar array 200. In addition to being simple to design and fabricate, the cross-bar architecture provides efficient use of the available space. Complete neuron connectivity inherent to the full cross-bar array can be converted to any arbitrary connectivity by electrical initialization or omitting mask steps at undesired locations during fabrication. The cross-bar array 200 can be configured to customize communication between the neurons (e.g., a neuron never communicates with another neuron). Arbitrary connections can be obtained by blocking certain synapses at the fabrication level. Therefore, the architectural principle of the system 400 can mimic all the direct wiring combinations observed in biological neuromorphic networks.

The cross-bar array 200 further includes driver devices $X_2$, $X_3$, and $X_4$ as shown in FIG. 4. The devices $X_2$, $X_3$, and $X_4$ can include interface driver devices. Specifically, the dendrites 426 have driver devices $X_2$ on one side of the cross-bar array 200 and level translator devices (e.g., sense amplifiers) $X_4$ on the other side of the cross-bar array. The axons 424 have driver devices $X_3$ on one side of the cross-bar array 200. The driver devices can include CMOS logic circuits implementing the functions described herein such as the "west" side and the "south" side (FIG. 3).

These signaling techniques are used for the operations to implement the DNN 100 using the cross-bar array 200 as depicted in FIG. 2A, FIG. 2B, and FIG. 2C. Referring to FIG. 2A, the forward propagation includes processing data through the neuron layers (110, 120, and 130) with the synaptic networks performing multiply-accumulate operations. The matrix-vector multiplications associated with the forward pass can be implemented with O(1) complexity using the depicted cross-bar array 200. For example, in order to perform Ax=b, where A is a matrix and x and b are vectors, the elements of A are mapped linearly to the conductance values of PCM devices 210 organized in the cross-bar 200. The x values are encoded into the amplitudes or durations of read voltages applied along the rows. The positive and negative elements of A are coded on separate devices together with a subtraction circuit. Alternatively, in one or more examples, negative vector elements are applied as negative voltages. The resulting currents along the columns are proportional to the result b. If inputs are encoded into durations, the result b is the total charge (e.g., current integrated over time). The property of the NVM device 210 that is used is the multi-level storage capability as well as the Kirchhoff circuit laws: Ohm's law and Kirchhoff's current law.

It should be noted that the description of the cross-bar array 210 and of the neuromorphic system 400 is one possible example implementation and that one or more embodiments of the present invention can be used in other types of implementation.

Typically, programming the NVM device 210 (updating the weights) is done by iteratively applying SET pulses with steadily increasing compliance current. Unlike RESET pulses, which can cause an abrupt transition to lower conductance values, the successive application of a partial SET pulse is considered to result in a more progressive increase in the conductance value of the NVM devices 210. Hence, for neuromorphic systems 400 using NVM devices 210, in existing solutions, the partial SET pulses are used to tune the PCM devices to the desired synaptic weights.

For example, the typical programming strategy for analog conductance tuning of NVM devices 210 is to iteratively apply SET pulses with steadily increasing compliance current (while also potentially increasing pulse duration) to reach target analog conductance values. The NVM devices 210 are corrected by an average scaling coefficient. However, encoding synaptic weight data into PCM based synaptic weights are not corrected by such average scaling coefficient over the drift duration.

Figure 5:
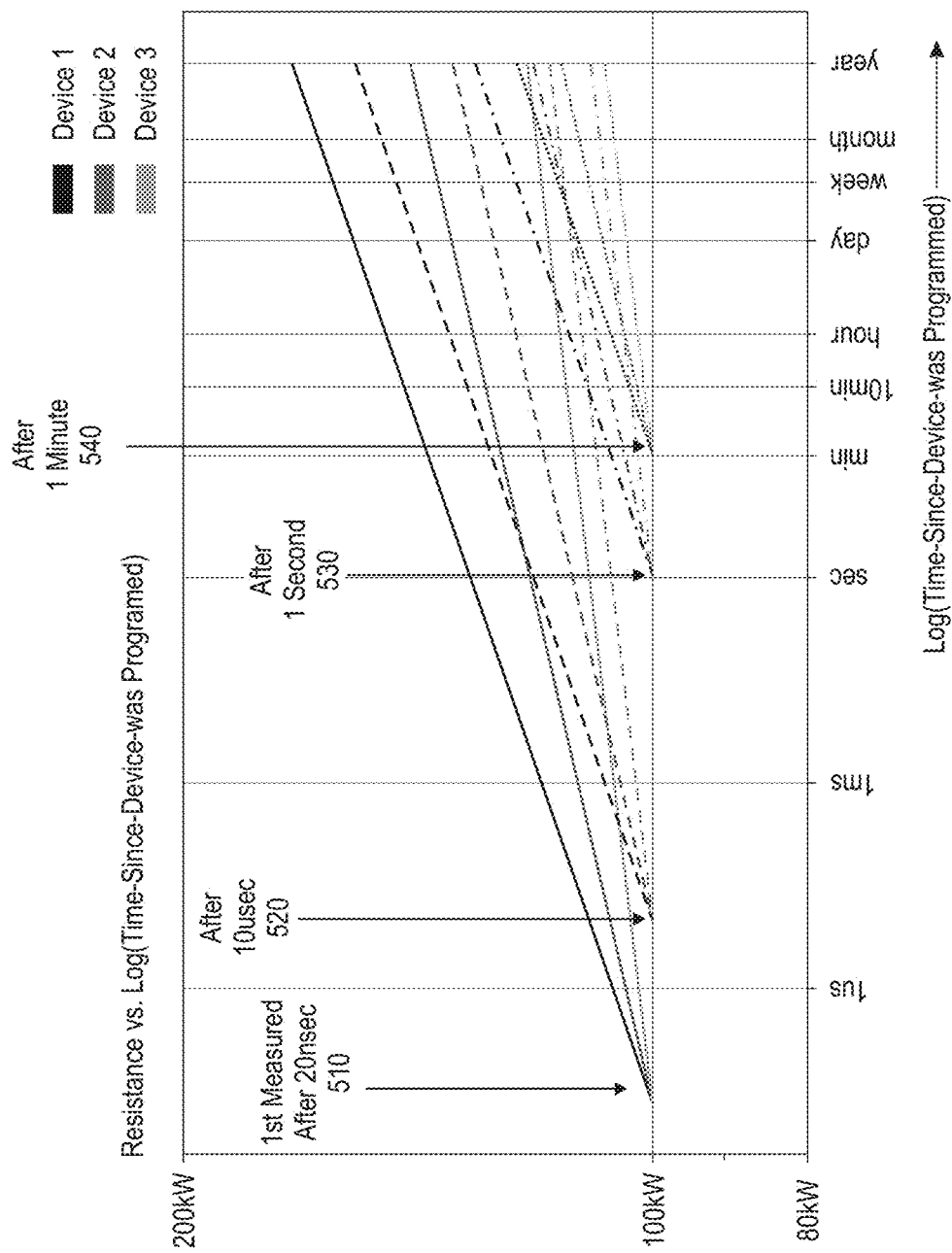
FIG. 5 depicts example drift of resistance/conductance values of phase change memory devices according to one or more embodiments of the present invention.

FIG. 5 depicts an example drift of resistance/conductance values of NVM devices according to one or more embodiments of the present invention. It is understood that the depiction is of exemplary values and that any other resistance/conductance values and drift are possible in other examples. FIG. 5 illustrates a drift in the resistance/conductance of separate NVM devices 210 over time. As can be seen, the devices can drift differently from each other. The different drifts for each device can be expressed as a drift coefficient ("ν" (nu) coefficient) of the respective NVM devices 210. The ν coefficient of an NVM device 210 indicates the trajectory of the conductance evolution for an NVM device 210, representing the slope of a straight line on a plot of log(conductance) vs. log(time).

Figure 6:
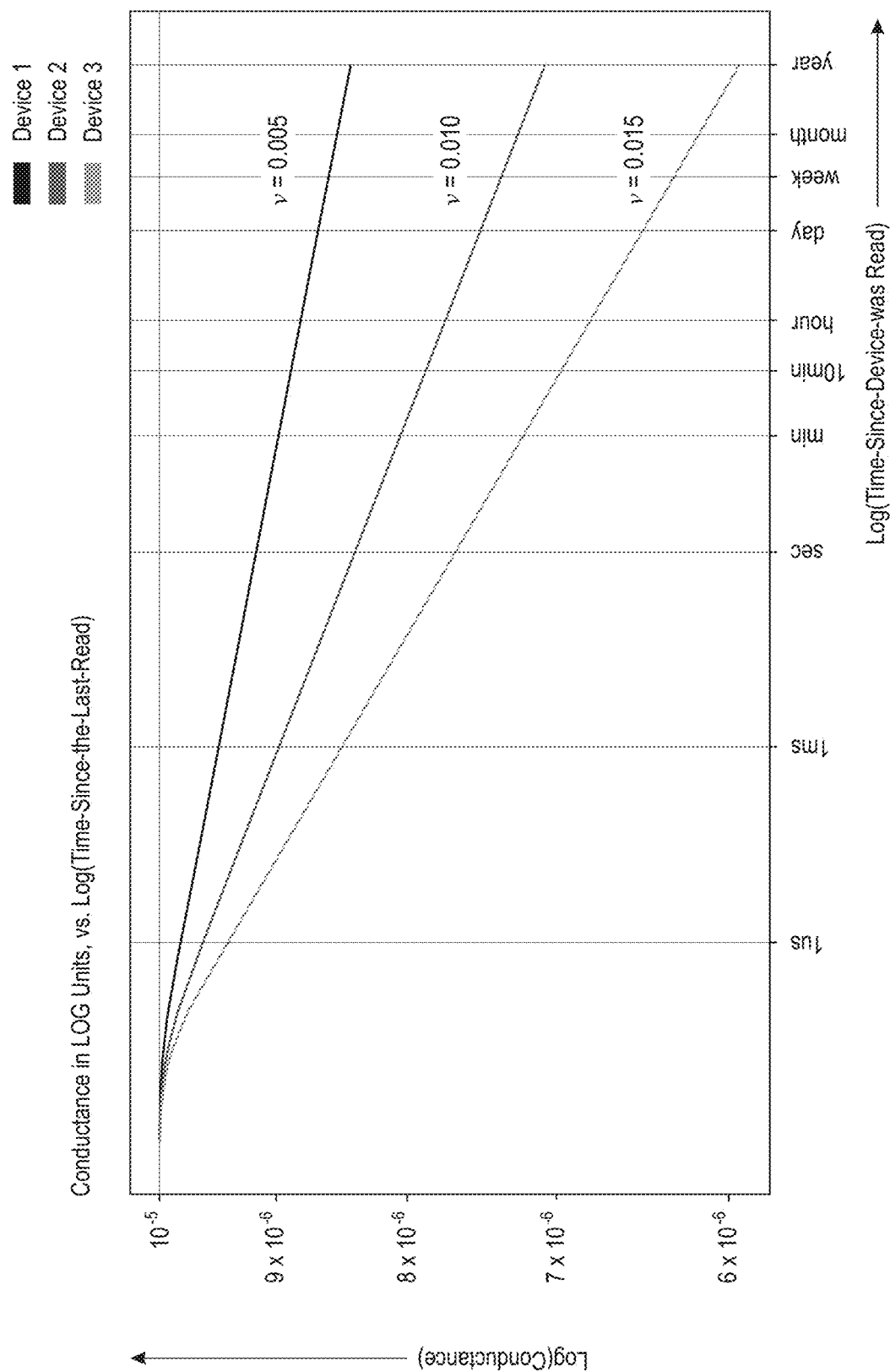
FIG. 6 depicts v coefficients for example devices according to one or more embodiments of the present invention.

FIG. 6 depicts ν coefficients for example devices according to one or more embodiments of the present invention. The plot in FIG. 6 shows the trajectories of change in conductance over time for separate NVM devices 210. The ν coefficients of the respective NVM devices are also shown. The conductance and the time when the conductance was last read are both plotted using the LOG scale. The ν coefficient is not a value that can be assigned to the NVM device 210. Rather, the ν coefficient seems to be randomly adopted by the NVM device 210 when the device is programmed. These phenomena are ascribed to the random distribution of polycrystalline grains within the NVM device after each programming event. Hence, the drift of the NVM device 210 is unpredictable, leading to the technical challenges discussed herein.

One or more embodiments of the present invention address such technical challenges by programming a weight value in an NVM device 210 (synapses) and checking a changed weight value in the NVM device 210 after a predetermined duration. For example, the changed weight value is checked after waiting from 1-60 seconds until the trajectory due to the ν coefficient is clear. If the changed weight value after the predetermined duration (e.g. 1-60 seconds) differs from a target value by at least a predetermined threshold, the NVM device 210 is reprogrammed.

This cycle is continued until the NVM device 210 selects a ν coefficient that is sufficiently close to the median of the expected distribution of ν coefficients. This can be checked at a reasonable interval of 1 second to 1 minute, by checking that the conductance of the device at that time is within a given bounding-box, related to the original bounding-box by a ratio that corresponds to the change in conductance for a device drifting with the median ν coefficient over that time interval. Because each check takes less than 1 minute per attempt, multiple programming attempts can be reasonably implemented in order to protect the neural network from "outlier" nu coefficients over long periods of time into the future. In other words, spending the "extra" time program the NVM device 210 multiple times is acceptable, considering that it results in the NVM device 210 being programmed in a manner that suppresses the weight value that will drift beyond a predetermined threshold. That is because the drift can require the NVM device 210 to be reprogrammed or result in erroneous results from the NVM device 210.

Figure 7:
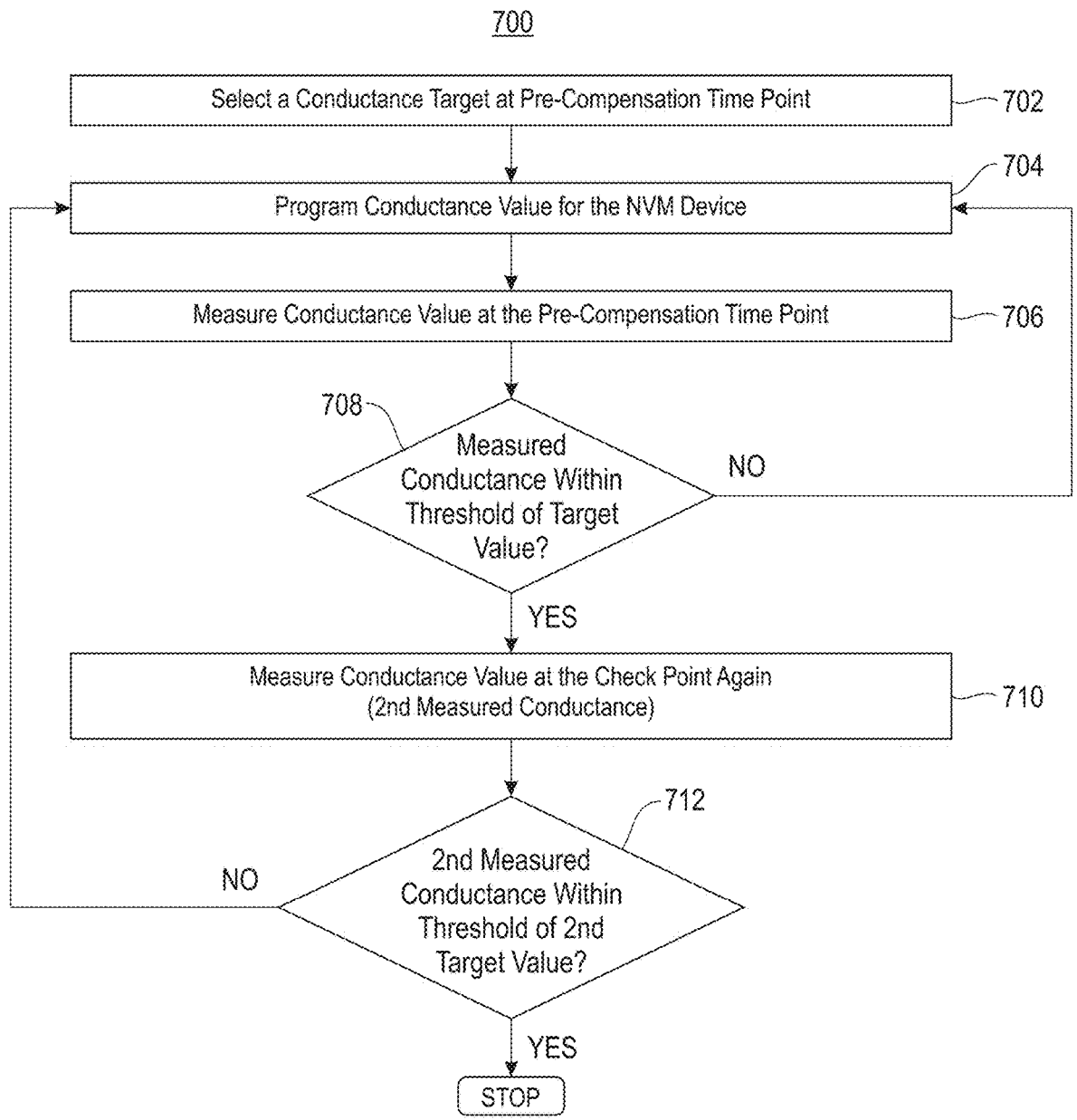
FIG. 7 depicts a flowchart of a method for suppressing outlier drift coefficients while programming phase change memory devices according to one or more embodiments of the present invention.
Figure 8:
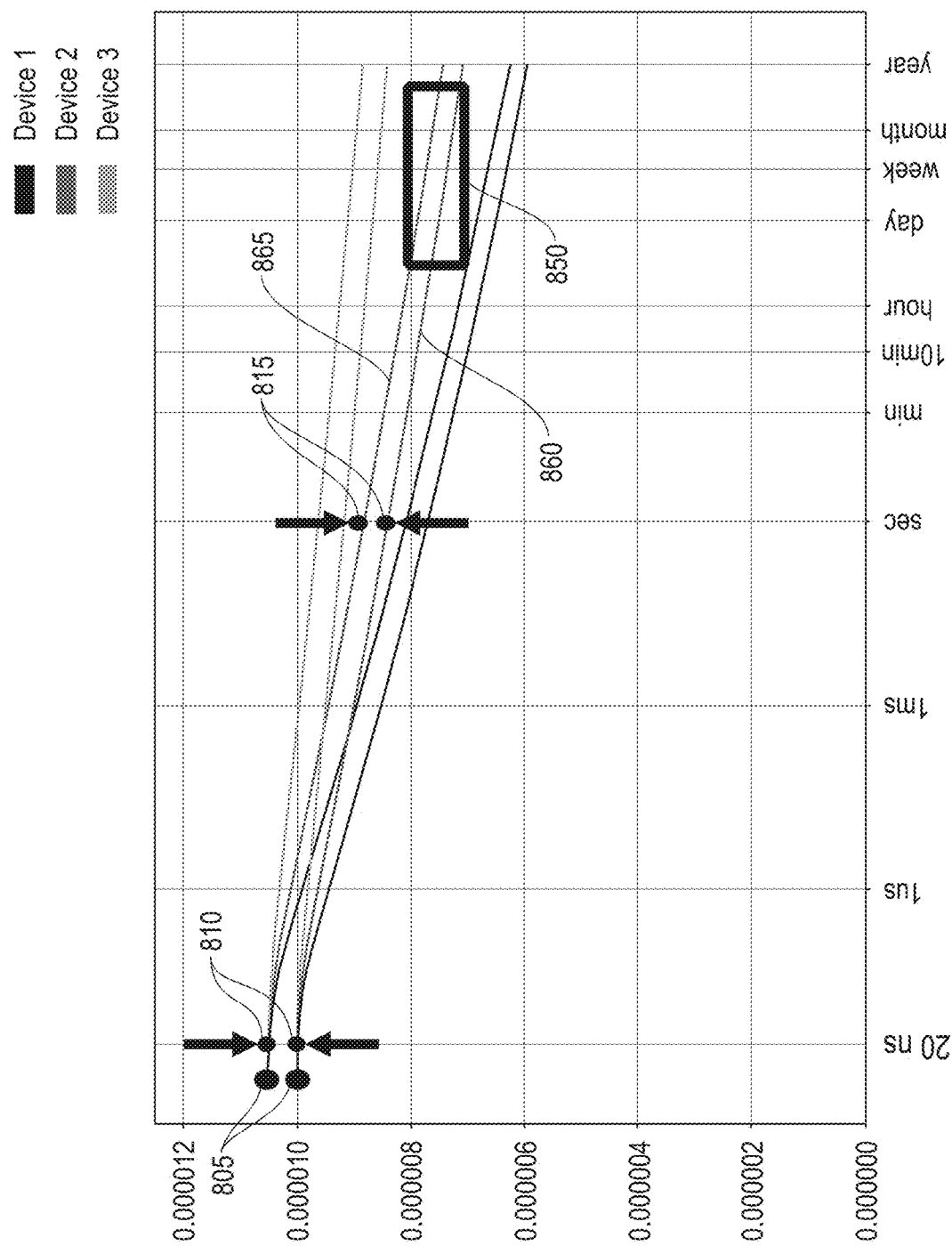
FIG. 8 depicts example phase change memory devices being programmed according to one or more embodiments of the present invention.

FIG. 7 depicts a flowchart of a method for suppressing outlier drift coefficients while programming NVM devices according to one or more embodiments of the present invention. FIG. 8 depicts example NVM devices being programmed according to the method 700 illustrated in FIG. 7.

The method 700 includes determining a conductance target for the NVM device 210 at a pre-compensation time-point 810 (e.g., 20 ns) that pre-compensates for the average expected drift between that time-point 810 after programming the NVM device 210 and a desired target window 850 (e.g. 7 hours, 2 weeks, 6 months etc.) after the programming time-point 805, at 702. The pre-compensation time-point 810 represents a predetermined duration (e.g. 20 ns) at which a change in conductance value of the NVM device 210 is checked.

Referring to FIG. 8, the NVM device 210 is programmed at time-point 805. The desired (target) time window 850 is depicted at approximately 6 hours-6 months since the programming time-point 805. It is understood that the desired time window 850 can be different in other examples. The desired time window 850 represents the duration for which the conductance value that is programmed into the NVM device 210 does not change beyond a predetermined threshold outside a predetermined interval around the expected drift at that duration due to the median drift coefficient, as described herein. The pre-compensation time-point 810 is depicted at a predetermined duration of 20 ns from the programming time-point 805. It is understood that the pre-compensation time-point 810 can be at a different duration in other examples.

Accordingly, determining the conductance target for the NVM device 210 at the pre-compensation time-point 810 includes calculating a conductance value that the NVM device 210 should have after the predetermined duration. If the conductance value of the NVM device 210 is within a predetermined threshold from the conductance target, the ν coefficient is deemed to be within an acceptable range such that the conductance value of the NVM device 210 will not drift beyond a predetermined threshold in the target window 850. If the conductance value of the NVM device 210, at the pre-compensation time-point 810, is not within the predetermined threshold from the conductance target, the ν coefficient is deemed to be out of the acceptable range. In other words, the conductance of the NVM device 210 is predicted to drift beyond the predetermined threshold in the target window 850.

In one or more examples, the method 700 includes determining multiple conductance target values at different time-points. For example, a first target conductance value is computed for the pre-compensation time-point 805, a second target conductance value is computed for a checkpoint 815, and so on. From a practical implementation perspective, the number of conductance target values that can be checked for has to be limited, for example to two, four, or any other such number that can facilitate multiple programming and checking of the NVM device within a limited time such as 1 minute, 5 minutes, or any other such programming time.

Referring now to FIG. 7, the NVM device 210 is programmed with the conductance value corresponding to the weight to be stored in the synapse represented by the NVM device 210, at 704. The programming happens at the time-point 805, as noted earlier. The method 700 further includes measuring the conductance value of the NVM device at the pre-compensation time-point (810), at 706. The measured conductance value is compared with the target conductance value, at 708. If the measured conductance value at the pre-compensation time-point 810 is not within a first predetermined threshold of the conductance target value corresponding to the pre-compensation time-point 810, the NVM device 210 is re-programmed and this check is continued (704, 706, 708).

If the measured conductance value is within the first predetermined threshold of the target conductance value, the method 700 measures the conductance value again at a second checkpoint 815, at 710. In the example depicted in FIG. 8, the checkpoint 815 is shown at 1 sec from the programming time-point 805; however, it is understood that other checkpoints can be used in other examples.

The second measured conductance value is compared with a second target conductance value corresponding to the checkpoint 815, at 712. If the second measured conductance value at the checkpoint 815 is not within a predetermined threshold of the second conductance target value corresponding to the checkpoint 815, the NVM device 210 is re-programmed and the operations of the method repeated (704, 706, 708, 710). If the second measured conductance value is within the predetermined threshold of the second target conductance value, the NVM device 210 is considered to be programmed with the outlier drift suppressed.

FIG. 8 depicts different cases, where the ν coefficient varies causing the conductance value to drift by different amounts at the pre-compensation point 810 and/or the checkpoint 815. The trajectories 860 and 865 in FIG. 8 represent the NVM devices being programmed such that the conductance values in the target window 850 are as desired. Other trajectories are depicted to illustrate that the measured conductance values not meeting the target conductance values lead the NVM devices 210 to have conductance values different from those desired in the target window 850.

Because the ν coefficient has randomness associated with it at the time of programming the NVM devices, for the majority of programming events, corresponding to the center region of the random distribution of ν coefficient, the conductance will be within the target ranges calculated. If the measured conductance values are within the thresholds of the target values, the NVM devices are most likely to have the desired conductance value at the time-span of interest for the application (here, 6 hours to 6 months), represented by the target time window 850. If instead the conductance, which was known to be successfully inside the first target range at pre-compensation time-point 810 (20 ns) after programming, is then outside the second target conductance range at checkpoint 815, then this indicates that the ν coefficient is an outlier. Accordingly, in this case, the expected conductance at the time-span of application interest can be predicted to be higher or lower than the desired value.

This method of reprogramming the NVM device 210 and checking the conductance measurements at the checkpoints after programming can be performed within a practically acceptable programming time limit. Accordingly, after multiple attempts to program the NVM device with an acceptable "average" ν coefficient, the outlier drift of the NVM device can be considered to be suppressed, and the conductance value predicted to be within the desired range during the target time window.

Figure 9:
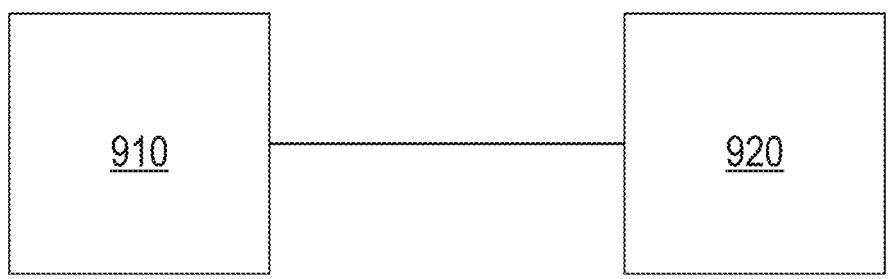
FIG. 9 depicts a system for programming phase change memory devices with suppression of outlier drift according to one or more embodiments of the present invention.

FIG. 9 depicts a system for programming NVM devices with suppression of outlier drift according to one or more embodiments of the present invention. The system 900 that is depicted includes a controller 910 and an NVM device system 920, such as a neural network system that includes one or more NVM devices 210. The controller 910 can be a computing device that includes one or more processing units that can execute one or more computer-executable instructions stored on a memory device. For example, the controller 910 can be a desktop computer, a tablet computer, a phone, a server computer, or any other computing device. The controller 910 and the NVM device system 920 are coupled with each other so that the controller 910 can configure resistance/conductance (i.e. weights) of the NVM devices 210 in the NVM device system 920. The controller 910 can further read/measure the resistance/conductance of the NVM devices 210. In one or more examples, the controller 910 implements one or more methods described herein. Although the controller 910 and the NVM device system 920 are shown as separate blocks in FIG. 9, in one or more embodiments of the present invention the controller 910 and the NVM devices 210 can be integrated as part of a single block.

The present invention may be a system, a method, and/or a computer program product at any possible technical detail level of integration. The computer program product may include a computer-readable storage medium (or media) having computer-readable program instructions thereon for causing a processor to carry out aspects of the present invention.

The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer-readable program instructions described herein can be downloaded to respective computing/processing devices from a computer-readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present invention may be assembler instructions, instruction-set-architecture (ISA) instructions, machine instructions, machine-dependent instructions, microcode, firmware instructions, state-setting data, configuration data for integrated circuitry, or either source-code or object code written in any combination of one or more programming languages, including an object-oriented programming language such as Smalltalk, C++, or the like, and procedural programming languages, such as the "C" programming language or similar programming languages. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer-readable program instruction by utilizing state information of the computer-readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the function/act specified in the flowchart and/or block diagram block or blocks.

The computer-readable program instructions may also be loaded onto a computer, other programmable data processing apparatus, or other device to cause a series of operational steps to be performed on the computer, other programmable apparatus or other device to produce a computer-implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method for suppressing outlier drift of a phase change memory (PCM) device, the method comprising:
   programming, by a controller, a conductance of the PCM device, the programming comprising:
      configuring the conductance of the PCM device to a first conductance value at a first time-point, the first time-point being a programming time-point;
      determining, at a first pre-compensation time-point, that the conductance of the PCM device has changed to a second conductance value that differs from a target conductance value by no more than a predetermined threshold; and
      reprogramming the PCM device to the first conductance value at a second time-point, including measuring the conductance again, but at a second pre-compensation time-point.

2. The computer-implemented method of claim 1, wherein the first pre-compensation time-point is at a predetermined time duration after the programming time-point.

3. The computer-implemented method of claim 2, wherein the target conductance value at the first pre-compensation time-point is determined based on a target time window, which has a second predetermined duration after the programming time-point, wherein the conductance of the PCM device is desired to be in a particular range during the target time window.

4. The computer-implemented method of claim 2, wherein programming is continued until the difference between (i) the second conductance value at the pre-compensation time-point and (ii) the target conductance value is less than the predetermined threshold.

5. The computer-implemented method of claim 1, wherein the programming further comprises:
   determining, at the first pre-compensation time-point, that the difference between the second conductance value at the pre-compensation time-point and the target conductance value is less than the predetermined threshold;
   determining at a first checkpoint, that the conductance of the PCM device has changed to a third conductance value that differs from a second target conductance value by no more than the predetermined threshold; and
   programming the PCM device to the first conductance value at a third time-point, including measuring said pre-compensation again.

6. The computer-implemented method of claim 5, wherein the first checkpoint is at a second predetermined time duration after the programming time-point.

7. The computer-implemented method of claim 5, wherein the second target conductance value at the first checkpoint is determined based on a target time window, which is at a second predetermined duration since the programming time-point, wherein the conductance of the PCM device is maintained within a particular range during the target time window.

8. The computer-implemented method of claim 1, wherein the PCM device is being used as a synapse in an artificial neural network system, the conductance being a weight that is assigned to the synapse.

9. The computer-implemented method of claim 1, wherein the PCM device comprises a plurality of PCM devices, each of the PCM devices being associated with a respective target conductance value.

10. The computer-implemented method of claim 1, wherein the conductance of the PCM device changes to the second conductance value because of conductance drift.

11. A system comprising:
   a controller; and
   a co-processor comprising one or more cross-bar arrays; and wherein, the controller is configured to implement an artificial neural network using the co-processor by mapping a layer of the artificial neural network with a cross-bar array, wherein implementing the artificial neural network comprises a method comprising:
      programming a conductance of a phase change memory (PCM) device from the cross-bar array, the programming comprising:
         configuring the conductance of the PCM device to a first conductance value at a first time-point, the first time-point being a programming time-point;
         determining, at a first pre-compensation time-point, that the conductance of the PCM device has changed to a second conductance value that differs from a target conductance value by no more than a predetermined threshold; and
         reprogramming the PCM device to the first conductance value at a second time-point, including measuring the conductance again, but at a second pre-compensation time-point.

12. The system of claim 11, wherein the first pre-compensation time-point is at a predetermined time duration after the programming time-point.

13. The system of claim 12, wherein the target conductance value at the first pre-compensation time-point is determined based on a target time window, which has a second predetermined duration after the programming time-point, wherein the conductance of the PCM device is to be in a particular range during the target time window.

14. The system of claim 12, wherein programming is continued until the difference between (i) the second conductance value at the pre-compensation time-point and (ii) the target conductance value is less than the predetermined threshold.

15. The system of claim 11, wherein the programming further comprises:
   determining, at the first pre-compensation time-point, that the difference between the second conductance value at the pre-compensation time-point and the target conductance value is less than the predetermined threshold;
   determining at a first checkpoint, that the conductance of the PCM device has changed to a third conductance value that differs from a second target conductance value by no more than the predetermined threshold; and
   reprogramming the PCM device to the first conductance value at a third time-point, including measuring said pre-compensation again.

16. The system of claim 15, wherein the first checkpoint is at a second predetermined time duration after the programming time-point.

17. The system of claim 15, wherein the second target conductance value at the first checkpoint is determined based on a target time window, which is at a second predetermined duration since the programming time-point, wherein the conductance of the PCM device is maintained within a particular range during the target time window.

18. The system of claim 15, wherein the PCM device is being used as a synapse in an artificial neural network system, the conductance being a weight that is assigned to the synapse.

19. A computer program product comprising a computer-readable storage medium having program instructions embodied therewith, the program instructions executable by a processing circuit to perform a method to suppress outlier drift of a phase change memory (PCM) device, the method comprising:
   programming a conductance of the PCM device, the programming comprising:
      configuring the conductance of the PCM device to a first conductance value at a first time-point, the first time-point being a programming time-point;
      determining, at a first pre-compensation time-point, that the conductance of the PCM device has changed to a second conductance value that differs from a target conductance value by no more than a predetermined threshold; and
      reprogramming the PCM device to the first conductance value at a second time-point, including measuring the conductance again, but at a second pre-compensation time-point.

20. The computer program product of claim 19, wherein the first pre-compensation time-point is at a predetermined time duration after the programming time-point.

21. The computer program product of claim 20, wherein the target conductance value at the first pre-compensation time-point is determined based on a target time window, which has a second predetermined duration after the programming time-point, wherein the conductance of the PCM device is to be in a particular range during the target time window.

22. The computer program product of claim 20, wherein programming is continued until the difference between (i) the second conductance value at the pre-compensation time-point and (ii) the target conductance value is less than the predetermined threshold.

23. A cross-bar array comprising:

a plurality of phase change memory (PCM) devices, a PCM being at each of a plurality of cross-points in the cross-bar array, wherein one or more PCM devices represents an analog synapse in an artificial neural network, wherein programming a conductance of a PCM device from the cross-bar array comprises:

receiving a signal to configure a conductance of the PCM device to a first conductance value at a first time-point, the first time-point being a programming time-point;

determining, at a pre-compensation time-point, that the conductance of the PCM device has changed to a second conductance value that differs from a target conductance value by no more than a predetermined threshold; and receiving another signal to configure the conductance of the PCM device to the first conductance value at a second time-point, including measuring the conductance again, but at a second pre-compensation time-point.

24. The cross-bar array of claim 23, wherein the pre-compensation time-point is at a predetermined time duration after the programming time-point, and wherein the target conductance value at the pre-compensation time-point is determined based on a target time window, which is at a second predetermined duration after the programming time-point, wherein the conductance of the PCM device is to be in a particular range during the target time window.

25. A computer-implemented method comprising:

configuring, from a plurality of phase change memory (PCM) devices in a cross-bar array, a conductance value of a PCM device by:

receiving a signal to configure the conductance value of the PCM device to a first conductance value at a first time-point, the first time-point being a programming time-point;

determining at a pre-compensation time-point, that the conductance value of the PCM device has changed to a second conductance value that differs from a target conductance value by no more than a predetermined threshold; and receiving another signal to configure the conductance value of the PCM device to the first conductance value at a second time-point, including measuring the conductance value again, but at a second pre-compensation time-point.

\* \* \* \* \*